United States Patent [19]

Fitch

[11] Patent Number: 5,386,143

[45] Date of Patent: Jan. 31, 1995

[54] HIGH PERFORMANCE SUBSTRATE, ELECTRONIC PACKAGE AND INTEGRATED CIRCUIT COOLING PROCESS

[75] Inventor: John S. Fitch, Newark, Calif.

[73] Assignee: Digital Equipment Corporation, Maynard, Mass.

[21] Appl. No.: 130,151

[22] Filed: Sep. 30, 1993

Related U.S. Application Data

[63] Continuation of Ser. No. 783,613, Oct. 25, 1991, abandoned.

[51] Int. Cl.⁶ .............................................. H01L 25/04
[52] U.S. Cl. .................................... 257/715; 257/712; 165/80.4; 165/104.33; 361/700
[58] Field of Search .............. 257/715, 712; 165/80.4, 165/104.33, 104.26; 361/700

[56] References Cited

U.S. PATENT DOCUMENTS

| | | | |
|---|---|---|---|
| 3,840,069 | 10/1974 | Fischer et al. | 165/104.26 |
| 3,911,547 | 10/1975 | Vinz | 165/104.26 |
| 3,984,861 | 10/1976 | Kessler, Jr. | 357/82 |
| 4,135,371 | 1/1979 | Kesselring et al. | 165/104.26 |
| 4,194,559 | 3/1980 | Eastman | 165/104.26 |
| 4,212,349 | 7/1980 | Andres et al. | 165/104.26 |
| 4,523,636 | 6/1985 | Meijer et al. | 165/104.26 |
| 4,627,487 | 12/1986 | Basiulis | 165/104.26 |
| 4,671,349 | 6/1987 | Wolk | 165/104.26 |
| 4,727,455 | 2/1988 | Neidig et al. | 361/385 |
| 4,884,627 | 12/1989 | Abtahi | 165/104.26 |

FOREIGN PATENT DOCUMENTS 0146657 5/1992 Japan ................................ 257/715

OTHER PUBLICATIONS

Dunn, P., "Heat Pipes," Pergamon Press.
Gerner, Frank M., "Final Report, Micro Heat Pipes", 1989 Research Initiation Program, Dec. 20, 1990.
Babin, B. R., et al., "Analysis and Testing of a Micro Heat Pipe During Steady-State Operation", The American Society of Mechanical Engineers, Aug. 5-8, 1989.
Fox, L. R., et al., "Multichip Package Cooling With Integral Heat Pipe", Digital Equipment Corporation.
Ogniewicz, Y., et al, "Porous Heat Pipe", Heat Transfer, Thermal Control, and Heat Pipes, vol. 70, Progress in Astronautics and Aeronautics, 1979.

Primary Examiner—Robert P. Limanek
Assistant Examiner—David Ostrowski
Attorney, Agent, or Firm—Denis G. Maloney; Albert P. Cefalo

[57] ABSTRACT

Integrated circuit package (10) includes a substrate (12) comprising a porous ceramic body (14). A non-porous covering (16) provides a hermetic seal around the porous ceramic body (14). A heat transfer liquid (18) partially fills pores (30) of the porous ceramic body (14). A plurality of integrated circuit chips (20) are attached to a surface of the substrate (12) by epoxy, solder or other bonds (22). On an opposite surface, the substrate (12) includes a plurality of heat transfer fins (24). In use, the heat transfer liquid (18) in the ceramic body (14) is vaporized to fill the balance of the pores (30) and condensed in a continuous heat pipe cycle to remove heat from the integrated circuits (20) mounted on the substrate.

23 Claims, 1 Drawing Sheet

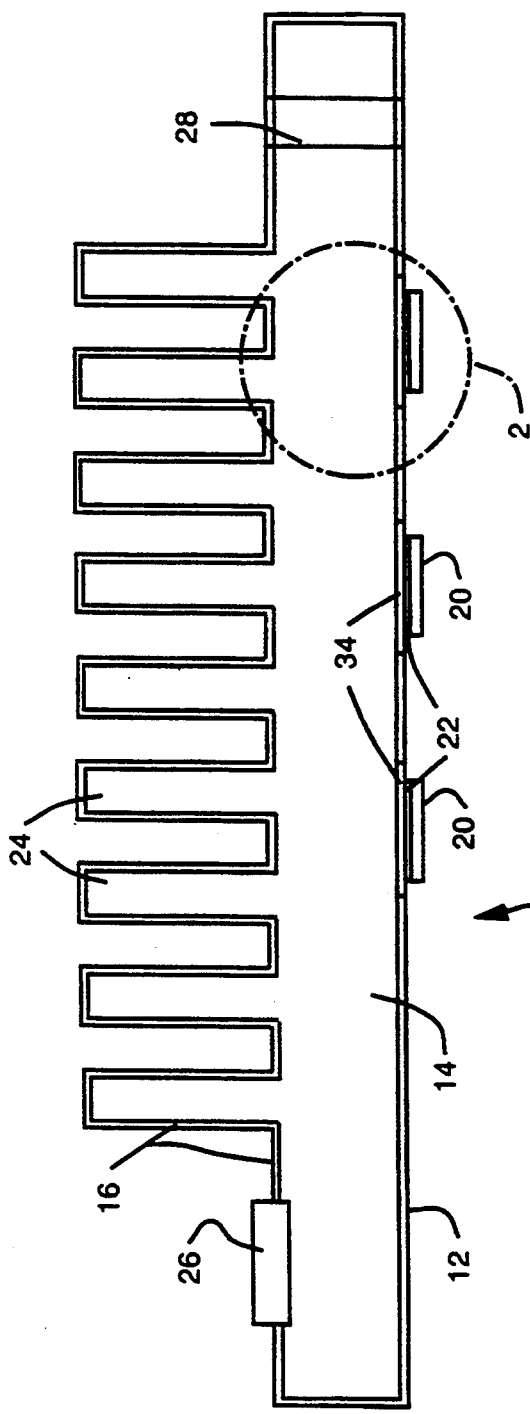
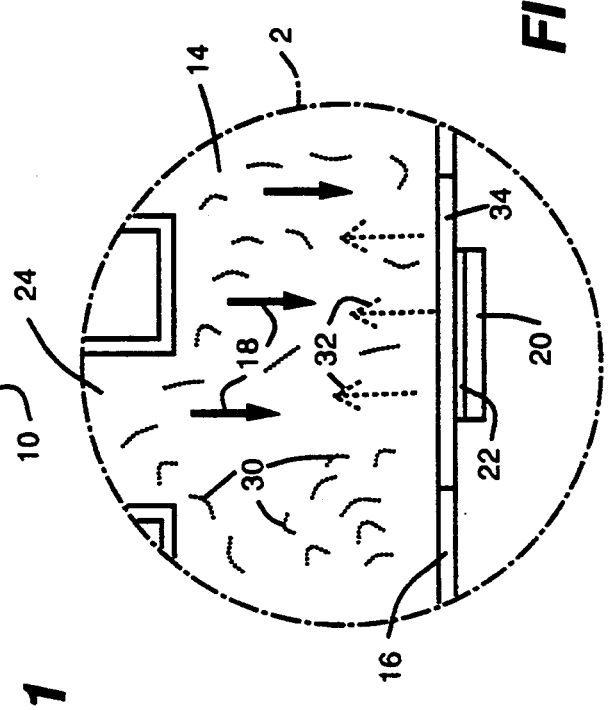
FIG. 1
FIG. 2

HIGH PERFORMANCE SUBSTRATE, ELECTRONIC PACKAGE AND INTEGRATED CIRCUIT COOLING PROCESS

This is a continuation, of U.S. application Ser. No. 07/783,613 filed Oct. 25, 1991 now abandoned.

BACKGROUND OF THE INVENTION

1. Field of the Invention

The present invention relates generally to packaging for an integrated circuit incorporating an improved substrate on which the integrated circuit is mounted and to an improved process for cooling integrated circuits that can be implemented with the improved substrate. More particularly, it relates to such a substrate and process which has an enhanced heat removal capability at a reasonable cost.

2. Description of the Prior Art

Substrates on which integrated circuits are mounted that are presently available do not provide all of the mechanical, electrical and thermal properties that are desired, particularly for high performance integrated circuits. Typically, the designer must sacrifice one property for another. For example, conventional ceramic substrates are very desirable from an electrical and mechanical standpoint, but they may not provide the thermal conductivity required for high performance integrated circuits. Molybdenum provides better thermal conductivity, but it is unfortunately an electrical conductor.

It is known to provide a heat pipe effect in porous media. Porous media heat pipes are a popular topic in space applications, since they do not rely on gravity to move the liquid around, but rather, the capillary forces created by the pores in the porous media move the liquid.

Recently, micro heat pipes have been demonstrated which move heat away from a hot source, such as an integrated circuit chip, in the lateral direction. Such heat pipes are manufactured by etching a small pattern of grooves in a flat piece of silicon. A cover is then sealed over the grooves while they are partially filled with a liquid. A heat source, such as the integrated circuit chip, at the center of the pattern generates vapor that moves away and through the pattern. At the perimeter of the pattern, the vapor condenses. The capillary forces in the grooves return the liquid back to the hot spot. Currently, this technology is limited to two dimensional, lateral heat movement.

At least one commercial heat pipe manufacturer, Thermacore, Lancaster, PA, has plans to introduce a conventional style heat pipe with an integral ceramic surface. The ceramic is not used to move the liquid with capillary forces, but it is used as a surface on which an integrated circuit could be mounted. The cavity of the heat pipe is essentially hollow. The cavity has the working fluid and a wick inside it. A disadvantage of this kind of heat pipe is cost, since the entire heat pipe could not be made from one piece of material.

Ceramics are used throughout electronic packaging as the conventional substrate on which integrated circuits are mounted. Their electrical insulating properties makes ceramics highly desirable substrates. The coefficient of thermal expansion for ceramics is reasonably close to that of silicon, the most common integrated circuit material. Typically however, the gas permeability of the ceramics used in electronics is close to zero, which would prevent the fluid movement required for the heat pipe phenomenon to occur.

Hermetic seals or coatings for ceramic substrates are also quite common. Ceramic surfaces have been coated by sputtering or electroless plating metals onto them. It is possible to coat ceramics with glass, since ceramics can take the very high temperatures of the glass firing operation.

Thus, while the heat pipe art and the integrated circuit packaging art are both well-developed, a need remains for a high performance integrated circuit package that provides suitable mechanical, electrical and thermal properties at a reasonable cost.

SUMMARY OF THE INVENTION

The attainment of these and related advantages and features may be achieved through use of the novel high performance substrate herein disclosed. A high performance substrate in accordance with this invention has a body of ceramic material with interconnected pores of a size to allow liquid to and vapor flow within the body by capillary action and pressure gradients. The interconnected pores define a volume of a given size. A heat transfer liquid is in a portion of the volume of said interconnected pores. An impermeable layer forms a hermetic seal on exterior surfaces of the ceramic material. In use, integrated circuit chips are mounted at a first region of the substrate, which comprises a heated region when the integrated circuits in the chips are operated. A second region of the substrate remote from the first region comprises a cooled region. The heat transfer liquid in the ceramic body at the first region is vaporized, travels to the second region due to pressure differential, condenses at the second region, and returns to the first region by capillary action in a continuous heat pipe cycle to remove heat from integrated circuits mounted on the substrate.

A process for cooling an integrated circuit chip mounted on a substrate body in accordance with the invention includes confining a heat transfer liquid within the substrate body. The heat transfer liquid is vaporized proximate to the integrated circuit chip with heat from the integrated circuit chip to produce heat transfer vapor. The heat transfer vapor is flowed away from the integrated circuit chip within the substrate body by a pressure differential. The heat transfer vapor within the substrate body is condensed away from the integrated circuit chip to produce the heat transfer liquid. The heat transfer liquid is flowed within the substrate body to a location proximate to the integrated circuit chip by capillary action.

The attainment of the foregoing and related advantages and features of the invention should be more readily apparent to those skilled in the art, after review of the following more detailed description of the invention, taken together with the drawings, in which:

BRIEF DESCRIPTION OF THE DRAWINGS

FIG. 1 is a cross-section view of an integrated circuit package including the high performance substrate of the invention.

FIG. 2 is an enlarged view of the region 2 in FIG. 1.

DETAILED DESCRIPTION OF THE INVENTION

Turning now to the drawings, more particularly to FIGS. 1 and 2, there is shown an integrated circuit package 10 in accordance with the invention. The package 10 includes a substrate 12 comprising a porous ceramic body 14. A non-porous covering 16 provides a hermetic seal around the porous ceramic body 14. A volatile and preferably inert heat transfer liquid 18 partially fills the pores of the porous ceramic body 14. A plurality of integrated circuit chips 20 are attached to a surface of the substrate 12 by epoxy, solder or other bonds 22. On an opposite surface, the substrate 12 includes a plurality of heat transfer fins 24. Other forms of cooling could also be used. A removable sealing plug 26 allows access to the porous ceramic body 14 through opening 25 in the hermetic seal of the covering 16. The substrate 12 has a bolt hole 28 allowing the package 10 to be readily attached to a larger electronic system.

The ceramic body 14 has interconnected pores 30 of suitable dimensions to allow flow of heat transfer vapor by pressure gradients within the body 14 and flow of the heat transfer liquid within the body 14 by capillary action. The body 14 is manufactured from a block of porous ceramic material, such as aluminum nitride, alumina or boron nitride, that is machined, pressed, extruded or molded to the desired shape. As an alternative to homogeneous pores, a matrix of small pores is commonly formed during the machining, pressing, extruding or molding for the movement of the heat transfer liquid by the capillary action, with larger channels being formed for vapor flow. A matrix with a pore size gradient is helpful, with small pores where liquid is needed near the integrated circuit chips 20 and large pores where the vapor travels. A suitable porous ceramic material is commercially available from Corning Glass Corporation under the trademark Cordiorite.

The non-porous covering 16 is provided by sputtering, vapor depositing or dipping various metals, or coating and firing glass on the porous ceramic body 14. If electrical isolation of the integrated circuit chips 20 is required, the sealing covering 16 is selectively deposited, to provide only glass under the integrated circuit chips 20 or to provide metal only under the chips 20 for solder,attachment and an organic sealant layer, such as polyimide, elsewhere. Electrical connections are also made between the chips 20 by laying down electrical traces 21 on the polyimide layer, connected to the chips 20 by wires 23.

The volatile heat transfer liquid 18 is sealed in the pores 30 by the sealing layer 16. The porous material 14 is partially filled with liquid 18 through the opening 25. Non-condensable gases are evacuated from the pores by pulling a vacuum on the porous matrix 14. The sealing plug 26 is then sealed in the opening 25. This liquid 18 comprises a working fluid to move most of the heat generated by the integrated circuit chips 20 through the substrate 12. The liquid 18 must have appropriate "wetting" action with the ceramic material of the body 14 in order for the capillary action to occur. A large portion of the pore 30 volume is left unfilled to leave room for vaporized liquid 32 to expand and travel toward the cooled regions of the substrate 12, where it condenses. For example, one third of the pore 30 volume filled with the liquid 18 is suitable, leaving two thirds of the volume for expansion and travel of the vaporized liquid 32. A suitable specific example for the heat transfer liquid 18 is a fluorocarbon liquid, commercially available from 3M Corporation, Minneapolis, Minnesota, under the trademark Fluorinert.

In operation, the substrate 12 has essentially two surfaces: heated and cooled. When the chips 20 generate heat on one surface of the substrate 12, the heat transfer liquid 18 inside the substrate, near the chips 20, absorbs the heat and boils. The expanding vapor 32 moves through the pores 30 toward the cooled side of the substrate 12. As the vapor 32 is cooled it condenses, giving up its heat. The heat is removed from the heat transfer fins 24 of the cooled surface by passing air, an attached heat sink, or liquid passing over the surface. The condensed heat transfer liquid 18 is then pulled back adjacent to the integrated circuit chips 20 by capillary forces. This continuous cycle is referred to as the heat pipe effect.

Large amounts of energy are required to vaporize a liquid; therefore, much heat can be moved by this method. Since both of these liquid-to-vapor and vapor-to-liquid processes occur around one temperature, the temperature throughout the substrate 12 is roughly constant. This means that the heated surface is not substantially higher in temperature than the cooled surface. This is a desirable condition in a heat exchanger such as this package 10.

The heat pipe effect gives a high value of apparent thermal conductivity for the substrate 12. This leads to a very low temperature drop over long distances within the substrate 12. The substrate has a low coefficient of thermal expansion, close to that of silicon, from the porous ceramic body 14. The structure of the package 10 allows for many geometries, i.e., the package can be of various shapes and thermal performance is not degraded. For example, as shown, cooling fins 24 are formed directly into the porous matrix material 14 and then sealed. This reduces a major thermal interface resistance into an otherwise attached heat sink. Attachment features, such as bolt holes 28, are also easily incorporated. These may be formed using a variety of manufacturing methods. The substrate 12 has a high electrical resistivity; therefore, the surface areas 34 that hold the chips 20 may be metallized for soldering without electrical shorts through the substrate. Gravity is not required to move the liquid because of capillary forces. Therefore, package orientation is independent of gravity. Electrical lines, such as a power distribution network, may be provided on the substrate 12. Old methods of attaining these same characteristics require either very expensive materials and techniques, such as laminated molybdenum and polyimides, or heterogeneous composites.

Packages incorporating the substrate are usable across a broad spectrum of products, from work stations with single chip processors to multi-chip modules on mainframe machines. The substrate could replace molybdenum and copper-tungsten slugs commonly found in packages today.

It should further be apparent to those skilled in the art that various changes in form and details of the invention as shown and described may be made. It is intended that such changes be included within the spirit and scope of the claims appended hereto.

What is claimed is:

1. A substrate for an electronic package comprising:
   a body of a single solid ceramic material having a heat receiving surface and a heat removal region, with the ceramic material of said body having a uniform porous structure;
   a heat transfer fluid residing in said uniform porous structure of said body; and
   a unitary impermeable layer forming a hermetic seal around said body to confine said heat transfer medium within said body.

2. The substrate of claim 1 wherein said ceramic body is selected from the group consisting of aluminum nitride, alumina, or boron nitride.

3. The substrate of claim 12 wherein said heat transfer fluid is a fluorocarbon.

4. The substrate of claim 22 further comprising:
a plurality of electrical contact pads positioned on said heat receiving surface; and
means for coupling said plurality of electrical contact pads and said electronic device.

5. The substrate of claim 4 wherein said plurality of electrical contact pads form electrically conductive traces.

6. The substrate of claim 5 wherein a plurality of electronic devices are positioned on said electrically conductive traces.

7. The substrate of claim 1 wherein said body includes a plurality of heat transfer enhancement features.

8. The substrate of claim 7 wherein said heat transfer enhancement features include heat transfer fins.

9. The substrate of claim 1 wherein said body further includes a sealing plug.

10. The substrate of claim 1 wherein said body defines an aperture to fasten said substrate to a discrete component.

11. A substrate for an electronic package, comprising:
a body of a single porous ceramic material, said body having a heat receiving surface for receiving a heat generating electronic device and a heat removal region, said porous ceramic material having a porous structure;
a heat transfer fluid residing in said porous structure of said porous ceramic material, said porous lattice structure including at least a first set of pores of a first size, proximately positioned to said heat receiving surface, interconnected with at least a second set of pores of a second size larger than said first size, proximately positioned to said heat removal region; and
a unitary impermeable layer forming a hermetic seal around said body to confine said heat transfer fluid within said body, said layer having an external heat receiving surface disposed on said heat receiving surface of said body.

12. The substrate of claim 11 wherein said porous ceramic material is selected from the group consisting of aluminum nitride, alumina, or boron nitride.

13. The substrate of claim 11 wherein said heat transfer fluid is a fluorocarbon.

14. The substrate of claim 11 further comprising:
a plurality of electrical contact pads positioned on said heat receiving surface; and
means for coupling said plurality of electrical contact pads and said electronic device.

15. The substrate of claim 14 wherein said plurality of electrical contact pads form electrically conductive traces.

16. The substrate of claim 15 wherein a plurality of electronic components are positioned on said electrically conductive traces.

17. The substrate of claim 11 wherein said body includes a plurality of heat transfer enhancement features.

18. The substrate of claim 17 wherein said heat transfer enhancement features include heat transfer fins.

19. The substrate of claim 11 wherein said body further includes a sealing plug.

20. The substrate of claim 11 wherein said body defines an aperture to fasten said substrate to a discrete component.

21. The substrate of claim 11 further comprising a plurality of pore regions interconnected between said first set of pores and said second set of pores, said plurality of pore regions forming a pore size gradient between said first set of pores and said second set of pores.

22. The substrate of claim 22 wherein said porous structure of said body allows said heat transfer fluid to flow, in the form of a vapor, away from said heat receiving surface toward said heat removal region, and to flow, in the form of a liquid, from said heat removal region toward said heat receiving surface.

23. The substrate of claim 11 wherein said porous structure of said body and said first set of pores and said second set of pores allow pressure differential forces to move said heat transfer fluid, in the form of a vapor, away from said heat receiving surface toward said second set of pores, said first set of pores and said second set of pores further allowing capillary action to move said heat transfer fluid, in the form of a liquid, toward said first set of pores.

* * * * *